(12) United States Patent
Klemperer et al.

(10) Patent No.: US 6,794,315 B1
(45) Date of Patent: Sep. 21, 2004

(54) ULTRATHIN OXIDE FILMS ON SEMICONDUCTORS

(75) Inventors: Walter G. Klemperer, Champaign, IL (US); Jason Lee, Liverpool (GB); Erik A. Mikalsen, Urbana, IL (US); David A. Payne, Champaign, IL (US)

(73) Assignee: Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 10/384,186

(22) Filed: Mar. 6, 2003

(51) Int. Cl.[7] .................. H01L 21/31; H01L 21/469
(52) U.S. Cl. .................. 438/785; 438/685; 438/785
(58) Field of Search ................... 438/683, 685, 438/758, 778, 785; 427/383.1, 419.1

(56) References Cited

U.S. PATENT DOCUMENTS

| | | | |
|---|---|---|---|
| 5,840,615 A | * 11/1998 | Aoki et al. | .............. 438/396 |
| 6,383,873 B1 | 5/2002 | Hegde et al. | |
| 6,420,279 B1 | 7/2002 | Ono et al. | |
| 6,465,371 B2 | * 10/2002 | Lim | .............. 438/785 |
| 6,479,404 B1 | 11/2002 | Steigerwald et al. | |
| 6,642,066 B1 | * 11/2003 | Halliyal et al. | .............. 438/16 |
| 2002/0001974 A1 | * 1/2002 | Chan | .............. 438/785 |
| 2003/0171005 A1 | 9/2003 | Tsujikawa et al. | |
| 2004/0038555 A1 | * 2/2004 | Sugita et al. | .............. 438/785 |

* cited by examiner

*Primary Examiner*—Alexander Ghyka
(74) *Attorney, Agent, or Firm*—Brinks Hofer Gilson & Lione

(57) ABSTRACT

A method of making a semiconductor structure includes contacting a surface of a semiconductor with a liquid including $Zr_4(OPr^n)_{16}$ to form a modified surface, activating the modified surface, and repeating the contacting and activating to form a layer of zirconia on the semiconductor surface.

38 Claims, 9 Drawing Sheets

ULTRATHIN OXIDE FILMS ON SEMICONDUCTORS

FEDERALLY SPONSORED RESEARCH OR DEVELOPMENT

The subject matter of this application was in part funded by the Department of Energy (Grant nos. DEFG02-91ER45439), through the Frederick Seitz Materials Research Laboratory at the University of Illinois at Urbana-Champaign. The government may have certain rights in this invention. Any opinions, findings, and conclusions or recommendations expressed in this publication do not necessarily reflect the views of the U.S. Department of Energy.

BACKGROUND

In the development of microelectronics, there is an ongoing effort to reduce the size of microelectronic devices and the elements that make up the devices. As these dimensions continue to shrink, the need for alternative gate dielectric materials will become more important. Silica, having an empirical formula of $SiO_2$ and commonly referred to as silicon dioxide, has conventionally been the material of choice for gate oxides because it readily forms on a silicon substrate by oxidation of the silicon. At thicknesses below about 2 nm, however, leakage currents through silica films become unacceptably high during normal operating conditions. Replacement of silica with materials having a higher dielectric constant ("high-K materials") has been investigated. Films of high-K materials, however, have typically been plagued by poor interfaces and high cost of production.

One class of high-K films is the metal oxide family of general empirical formula $MO_x$ (where "M" is a metal and x is from 0.01 to 4). Metal oxide films can be prepared through a variety of techniques. For example, vapor deposition of a metal oxide can be accomplished by treatment of the surface with a vaporized metal (i.e. physical vapor deposition). Vapor deposition of a metal oxide can also involve treatment of the surface with a vaporized metal alkoxide of the general formula $M(OR)_y$, where y is from 1 to 8, and R is an alkyl group. This process is referred to as chemical vapor deposition (CVD). "Alkyl" refers to a substituted or unsubstituted, straight, branched or cyclic hydrocarbon chain containing from 1 to 20 carbon atoms. The chemisorbed layer formed is then treated with an activating agent such as an oxidizing agent or water, or by exposure to heat or light to form the $MO_x$ film. See, for example, Tada, H. *Langmuir*, 11, 3281 (1995); and Zechmann, C. A. et al. *Chem. Mater.*, 10, 2348 (1998).

One particularly interesting high-K material is zirconia, commonly referred to as zirconium oxide. The term "zirconia" is defined herein as a substance having an empirical formula of $ZrO_2$, and which may include trace amounts of impurities such as hafnium, water, or hydrocarbons. Zirconia has good performance characteristics as a dielectric gate material due to its stability on silicon.

In addition to vapor deposition processes, a conventional method of forming films of zirconia or other metal oxides on a semiconductor such as silicon is atomic layer deposition (ALD). The ALD process involves a high temperature condensation of evaporated metal-containing precursors on the semiconductor surface, followed by a hydrolysis reaction with water, and then repeating the condensation and hydrolysis one or more times. Anhydrous zirconium alkoxides are stable at ambient temperature and form zirconia through a series of hydrolysis (1) and condensation (2) reactions:

Zr—O-alkyl+$H_2O$→Zr—OH+alcohol (1)

Zr—OH+Zr—O-alkyl→Zr—O—Zr+alcohol (2).

This approach of using alternating surface reactions can be employed in a CVD chamber to grow zirconia films on a substrate using $Zr[OC(CH_3)_3]_4$ at temperatures ranging from 150° C. to 300° C. Hydroxyl (—OH) groups on the surface of the substrate are believed to provide initial sites for condensation reactions. The reactions between zirconium alkoxide groups and the hydroxyl groups yield a single layer of chemisorbed zirconium alkoxide according to reaction (3):

Surf-OH+Zr(O-alkyl)$_4$→Surf-O—Zr—(O-alkyl)$_3$+alcohol (3).

The adsorbed layer [—Zr—(O-alkyl)$_3$] is "protected" from multilayer formation by the remaining unreacted —O-alkyl groups. The zirconium alkoxide adsorbed on the surface is then "deprotected" through alkyl group elimination by hydrolysis according to reaction (4):

Surf-O—Zr—(O-alkyl)$_3$+$3H_2O$→Surf-O—Zr—(OH)$_3$+3 alcohol (4).

A second exposure to zirconium alkoxide results in further surface condensation as in (3). Through repeated condensation-elimination cycling, a robust zirconia film is formed layer by layer. See, for example, Kukli, K. et al. *Chem. Vap. Deposition*, 6 (2000), p. 297.

The conventional methods of forming metal oxide films, including zirconia and $HfO_2$ films, on semiconductors have met with mixed success. Disadvantages of these methods include the high cost of using elevated temperatures and/or reduced pressures for depositing the metal oxide precursors on the semiconductor surface. Also, due to the elevated temperatures used, a thick oxide interface, containing silicon and the metal from the metal oxide being formed, can be present between the silicon substrate and the desired high-K metal oxide film. Irregularities in the surface of the metal oxide films and/or in the interface between the film and the semiconductor can also be problematic.

It is thus desirable to provide thin metal oxide films on semiconductors using lower temperature processes. Preferably, these metal oxide films do not contain significant surface irregularities and can be formed reproducibly. High-quality, ultrathin metal oxide films would likely be useful as gate dielectrics in semiconductor structures, as dielectrics in metal oxide semiconductor capacitors, and as barrier layers in semiconductor processing.

BRIEF SUMMARY

In a first embodiment of the invention, there is provided a method of making a semiconductor structure, comprising contacting a surface of a semiconductor with a liquid comprising $Zr_4(OPr^n)_{16}$ to form a modified surface; activating the modified surface; and repeating the contacting and activating to form a layer of zirconia on the semiconductor surface.

In a second embodiment of the invention, there is provided a method of making a semiconductor structure, comprising obtaining a liquid comprising analytically pure $Zr_4$ $(OPr^n)_{16}$; contacting a surface of a semiconductor with the liquid in an inert atmosphere to form a modified surface; rinsing the modified surface; hydrolyzing the modified surface with an aqueous liquid comprising n-propanol to form an activated surface; drying the activated surface; repeating the contacting, rinsing, hydrolyzing, and drying to form a layer of zirconia on the semiconductor surface; and heat treating the semiconductor comprising the layer of zirconia.

In a third embodiment of the invention, there is provided a semiconductor structure comprising a semiconductor substrate and a layer comprising zirconia on the substrate, the layer having an equivalent oxide thickness of not more than 2 nanometers. The semiconductor structure has a leakage current less than 0.002 A/cm$^2$ when subjected to a potential of 1 volt.

In a fourth embodiment of the invention, there is provided a semiconductor substrate comprising a first surface and a second surface; a layer comprising zirconia on the first surface; a first layer of a conductor on at least a portion of the zirconia layer; and a second layer of a conductor on at least a portion of the second surface. The capacitor has a leakage current less than 0.002 A/cm$^2$ when subjected to a potential of 1 volt in accumulation.

DETAILED DESCRIPTION

Figure 1:
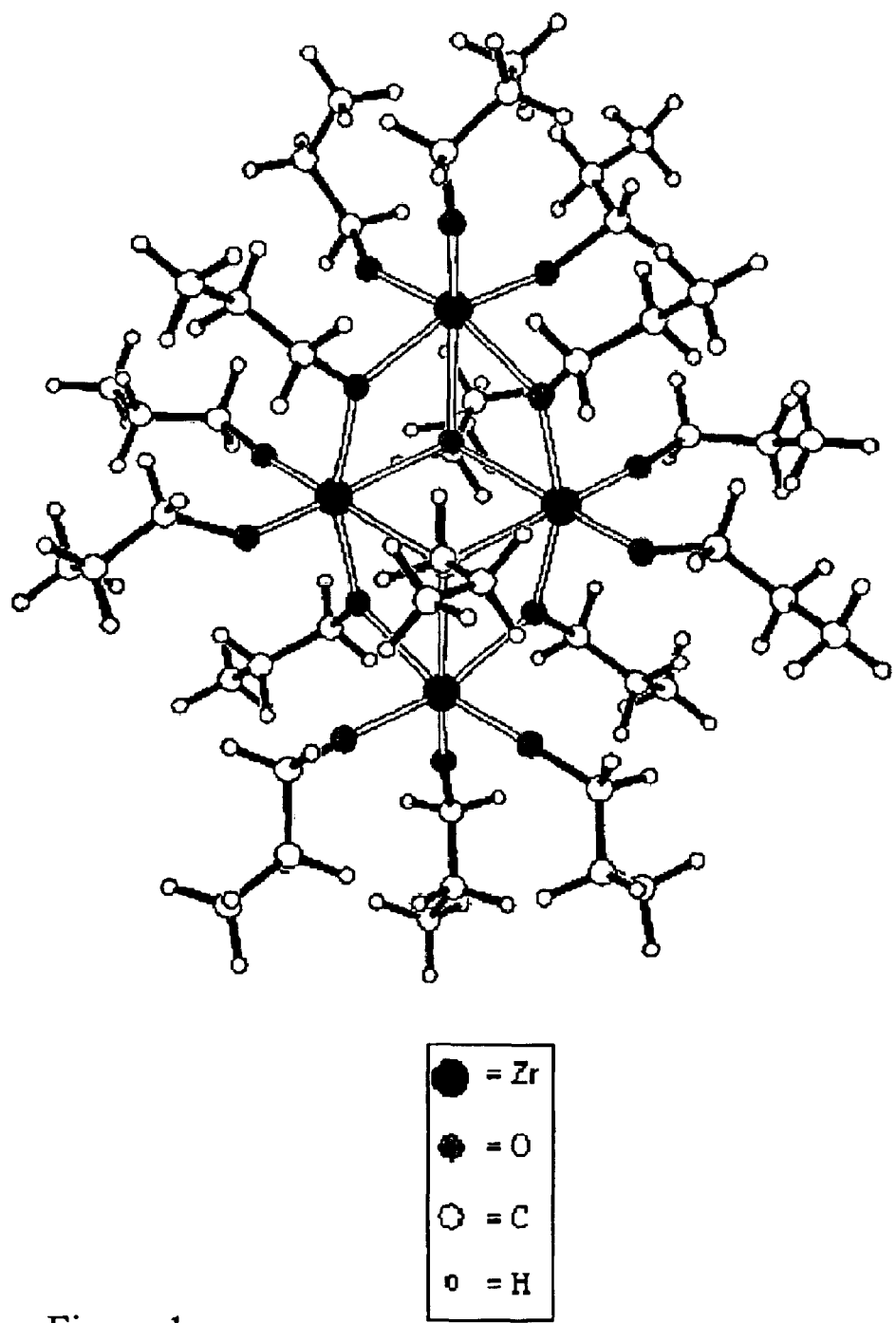
FIG. 1 is a diagram of a representative structure for $Zr_4(OPr'')_{16}$.

In a first embodiment of the invention, a method of making a semiconductor structure includes contacting a surface of a semiconductor with a liquid comprising $Zr_4(OPr'')_{16}$ to form a modified surface, activating the modified surface, and repeating the contacting and activating to form a layer of zirconia on the semiconductor surface.

In a second embodiment of the invention, a method of making a semiconductor structure includes obtaining a liquid containing analytically pure $Zr_4(OPr'')_{16}$, contacting a surface of a semiconductor with the liquid in an inert atmosphere to form a modified surface, rinsing the modified surface, hydrolyzing the modified surface with an aqueous liquid containing n-propanol to form an activated surface, and drying the activated surface. The method also includes repeating the contacting, rinsing, hydrolyzing, and drying to form a layer of zirconia on the semiconductor surface, and heat treating the semiconductor comprising the layer of zirconia.

In a third embodiment of the invention, a semiconductor structure includes a semiconductor substrate and a layer containing zirconia on the substrate. The zirconia containing layer may have an equivalent oxide thickness of 2 nanometers or less, and the semiconductor structure may have a leakage current less than 0.002 A/cm$^2$ when subjected to a potential of 1 volt.

In a fourth embodiment of the invention, a semiconductor substrate includes a first surface and a second surface, a layer containing zirconia on the first surface, a first layer of a conductor on at least a portion of the zirconia layer, and a second layer of a conductor on at least a portion of the second surface. The capacitor may have a leakage current less than 0.002 A/cm$^2$ when subjected to a potential of 1 volt in accumulation.

The term "semiconductor structure," as used herein, is defined as any structure containing a semiconducting material (a.k.a. "semiconductor") and another material that is not semiconducting. Examples of semiconducting materials include silicon, germanium, and mixtures thereof; doped titanium dioxide; 2–6 semiconductors, which are compounds of at least one divalent metal (zinc, cadmium, mercury and lead) and at least one divalent non-metal (oxygen, sulfur, selenium, and telurium) such as zinc oxide, cadmium selenide, cadmium sulfide, mercury selenide, and mixtures thereof; and 3–5 semiconductors, which are compounds of at least one trivalent metal (aluminum, gallium, indium, and thalium) with at least one trivalent non-metal (nitrogen, phosphorous, arsenic, and antimony) such as gallium arsenide, indium phosphide, and mixtures thereof. Preferred semiconducting materials include silicon, germanium, gallium arsenide, and cadmium sulfide.

The term "inert," as used herein, is defined as chemically non-reactive in the context of the substance or environment. For example, an inert atmosphere does not contain ingredients that can chemically react with the substances used in the inert atmosphere. Likewise, an inert solvent in a liquid mixture does not react with the other ingredients present in the mixture or with other substances with which the solvent is brought into contact.

The term "anhydrous," as used herein, is defined as having only undetectable amounts of water, if any.

The metal alkoxides used to prepare metal oxide films on semiconductors according to the present invention are substances having the general formula $M_4(OR''')_{16}$. The notation "$R'''$" denotes an unbranched alkyl group bonded to the oxygen through a terminal carbon, also referred to as an "n-alkyl" group. Specifically, metal alkoxides useful for forming metal oxide films on semiconductors include $Zr_4(OPr'')_{16}$ and $Hf_4(OPr'')_{16}$. Preferably, the metal alkoxide is $Zr_4(OPr'')_{16}$, which can be further reacted and processed to form thin, high-quality films of zirconia.

The species having formula $M_4(OR''')_{16}$ can also be represented by the empirical formula $M(OR''')_4$. Typically, metal alkoxides having this empirical formula are not, in fact, $M_4(OR''')_{16}$, but actually include a variety of compounds and molecular formulas, such that the overall molar ratio of metal to alkoxide in a sample is approximately 1:4. The reactivity of these conventional metal alkoxides contributes to their utility in the formation of metal oxide ($MO_x$) films, as illustrated in general reaction scheme (5):

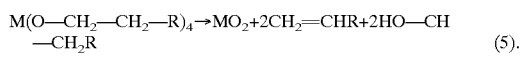

This reaction is believed to be a chain reaction including steps (6) and (7):

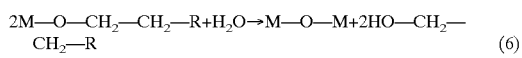

Metal n-alkoxide decomposition can thus be induced by trace amounts of an initiator, usually water or alcohol. (Bradley, D. C. et al. *Trans. Faraday Soc.*, vol. 55, 2117–2123 (1959); Bradley, D. C. et al. *J. Appl. Chem.*, vol. 9, 435–439 (1959)) In fact, zirconia is known to be a catalyst for alcohol dehydration. (Zechmann et al., 1998)

Although metal alkoxides readily react to form $MO_x$, a disadvantage to this reactivity is the difficulty of preparing absolutely pure $M(OR^n)_4$. Rather, conventional samples of $M(OR^n)_4$ actually contain a certain amount of M—O—M and/or M—OH moieties. For example, Zr(IV) n-alkoxides and other Zr(IV) alkoxides containing β-hydrogen atoms are extremely difficult to purify. (Turevskaya, E. P. et al. *Russ. Chem. Bull.*, vol. 44, 734–742 (1995); Turova, N.Y. et al. *Polyhedron*, vol. 17, 899–915 (1998)) Crystallization does not generally improve the purity of $Zr(OPr^n)_4$, and repeated recrystallizations typically yield increasingly impure material, possibly because of the extreme moisture-sensitivity of the compound.

One example of a metal alkoxide is $Zr_4(OPr^n)_{16}$, which can be prepared from tetra-n-propyl zirconate, $Zr(OPr^n)_4$. The starting material $Zr(OPr^n)_4$ may be prepared by treating $ZrCl_4$ with n-propanol in the presence of ammonia. (Bradley, D. C. et al. *J. Chem. Soc.*, 280–285 (1951)) Another method of preparing $Zr(OPr^n)_4$, which typically yields product with higher purity, involves alkoxide exchange of tetra-isopropyl zirconate $(Zr(OPr^i)_4)$ with n-propanol. (Bradley, D. C. et al. *J. Chem. Soc.*, 2025–2030 (1953)) The tetra-n-propyl zirconate prepared by the conventional alkoxide exchange method is characterized as a highly viscous liquid with a boiling point of 208° C. at 0.1 mm Hg. Tetra-n-propyl zirconate is typically provided as a 70 wt % solution in n-propanol, and the alcohol solvent can be removed by distillation at 85–98° C. under nitrogen ($N_2$) at ambient pressure to provide a waxy solid. The solid may then be fractionally distilled under $N_2$ at a pressure of about $10^{-2}$ mm Hg. The fraction that distills at 225–245° C. is a clear, colorless liquid that solidifies upon contact with the receiving flask. This fraction is pure $Zr(OPr^n)_4$ and is believed to have the molecular formula $Zr_4(OPr^n)_{16}$.

In the method of the present invention, $Zr_4(OPr^n)_{16}$ is purified by rapid fractional distillation of $Zr(OPr^n)_4$ at low pressure, for example $10^{-2}$ mm Hg. The first distillation fraction, a highly viscous liquid at ambient temperature and pressure, is collected between 185–220° C. The amount of material collected in the first fraction is dependent upon the purity of the crude material, with relatively pure starting material yielding a relatively small amount of the first fraction. The first fraction, containing both $Zr_4(OPr^n)_{16}$ and its hydrolysis product $Zr_3O(OPr^n)_{10}$, is similar to the liquid produced by the $Zr(OPr^i)_4$/n-propanol exchange. The second distillation fraction, collected between 225 and 245° C., is analytically pure $Zr_4(OPr^n)_{16}$, a white solid at ambient temperature and pressure. The method of purification by distillation at low pressure and high temperature over a short time period can likely be extended to other metal alkoxide systems, including alkoxide compounds of hafnium, titanium, scandium, yttrium, indium, and ytterbium.

Analytically pure tetra-n-propyl zirconate is identified by proton nuclear magnetic resonance spectroscopy ($^1H$ NMR) in cyclohexane-$d_{12}$ solution at ambient temperature. In the spectrum for $Zr_4(OPr^n)_{16}$, four triplets are observed in the methyl proton region at δ 0.94, 0.90, 0.86, and 0.83 (at 500 megahertz (MHz)), with relative intensities 3:2:2:1. If the hydrolysis product $Zr_3O(OPr^n)_{10}$ is present in the sample, however, low-intensity triplets can be observed at δ 0.93 and 0.92 (at 500 MHz). (Turova et al., 1998) Unless special precautions are taken, NMR samples of $Zr_4(OPr^n)_{16}$ are generally contaminated with 1–3% of this impurity due to the extreme moisture-sensitivity of $Zr_4(OPr^n)_{16}$. Also, elemental analyses generally report slightly higher values for zirconium and slightly lower values for carbon, relative to the amounts calculated for each based on the ratios in the empirical formula. Analytically pure $Zr_4(OPr^n)_{16}$ is defined as having a purity of at least 97% as measured by NMR spectroscopy. Preferably the $Zr_4(OPr^n)_{16}$ used in the present invention has a purity of at least 97% as measured by NMR spectroscopy, and more preferably has a purity of at least 99% as measured by NMR spectroscopy. The crystal structure of analytically pure $Zr_4(OPr^n)_{16}$ has been reported in Day, V. W. et al., *Inorg. Chem.*, vol. 40, 5738–5746 (2001). Without wishing to be bound by any theory of operation, it is believed that $Zr_4(OPr^n)_{16}$ has the molecular structure illustrated in FIG. 1.

Figure 2:
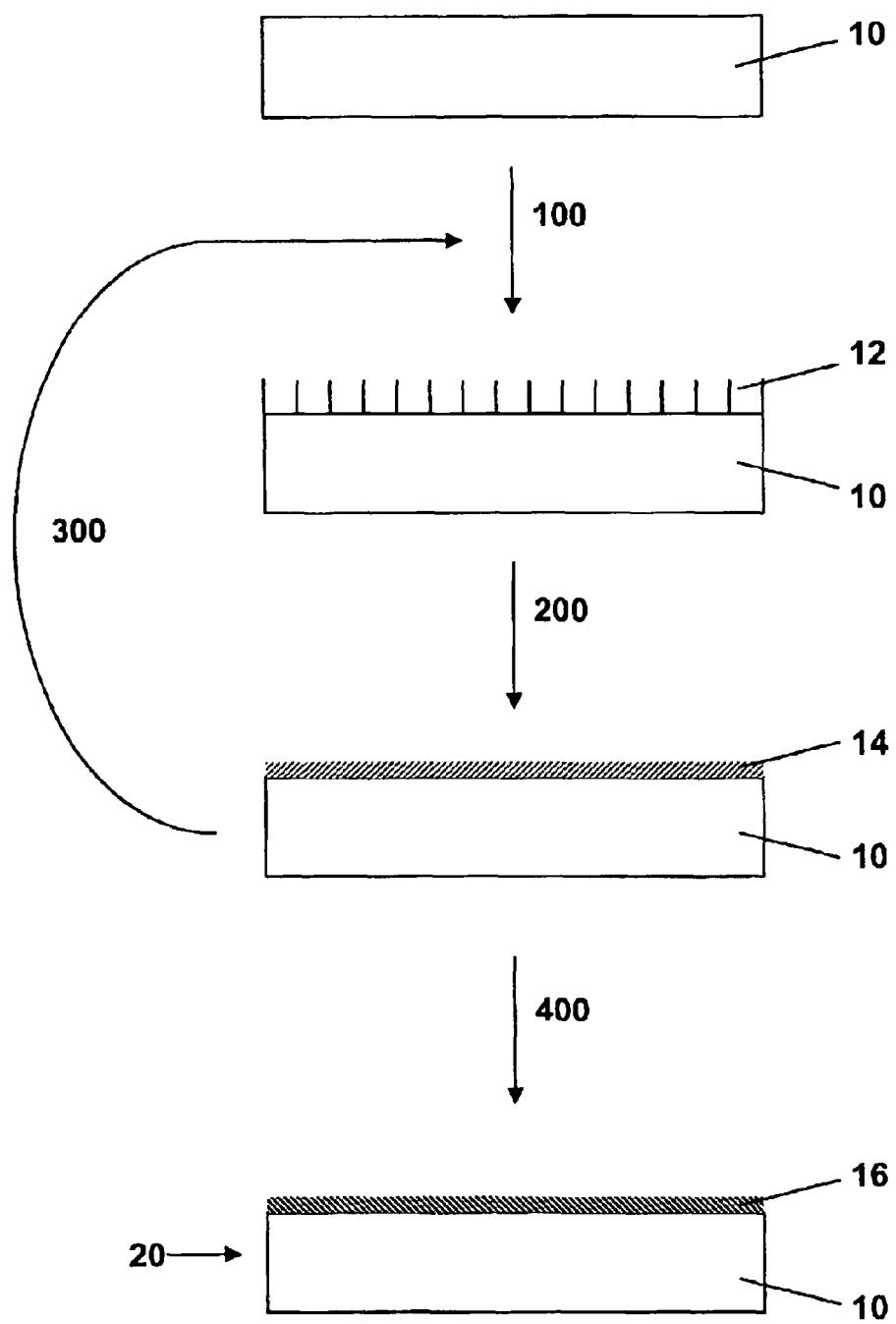
FIG. 2 is a diagram of a process of forming a layer of zirconia on a semiconductor substrate.

The analytically pure $Zr_4(OPr^n)_{16}$ can be used to form thin zirconia films which are substantially free of defects. Referring to the diagram of FIG. 2, the process for producing these films preferably follows a sequence of deposition 100 of the metal alkoxide, activation 200 of the modified surface 12 containing the metal alkoxide, and repetition 300 of the deposition and activation until a film 14 of the desired thickness is formed. An optional heat treatment 400 can be performed to provide a semiconductor structure 20 having the zirconia film 16 on the semiconductor substrate 10. The semiconductor substrate 10 to be coated is contacted 100 with a solution of $Zr_4(OPr^n)_{16}$ in an inert solvent that does not react with the zirconium alkoxide or the substrate during the time necessary to form films. Useful inert solvents include diethylether, methylene chloride, 1,2-dichloroethane, and hydrocarbons such as methyl cyclohexane, toluene, benzene, heptane, and pentane. The substrate is thus coated with a layer 12 of the metal alkoxide. Preferably, the deposition is carried out in an inert atmosphere, such as argon or nitrogen, to avoid premature hydrolysis of the zirconium compound.

The $Zr_4(OPr^n)_{16}$ may be adsorbed onto the surface or, preferably, chemically reacts with the surface to bond at least one of the zirconium atoms to the surface either directly or through a Zr—O— bond. This treatment with $Zr_4(OPr^n)_{16}$ is referred to herein as "condensation," since it is believed that the alkoxy substituent is eliminated as an alcohol (analogous to reaction (3)). Referring again to FIG. 2, this modified surface 12 is then activated by treatment 200 with an activating agent. Without wishing to be bound by any theory of operation, it is believed that the activation can form one or more Zr—OH bonds, possibly by a process analogous to reaction (4). The activated surface 14 can then be treated 300 with additional $Zr_4(OPr^n)_{16}$, allowing for condensation of more $Zr_4(OPr^n)_{16}$ moieties with the surface, and these moieties can also be activated.

Repetition of the deposition of $Zr_4(OPr^n)_{16}$ and the activation of the modified surface containing the condensed $Zr_4(OPr^n)_{16}$ can allow for a gradual buildup of a zirconia film 14. After the treatments with $Zr_4(OPr^n)_{16}$ and the activation are complete, it may be desirable to subject the film to a heat treatment (arrow 400 in FIG. 2). Without wishing to be bound by any theory of operation, it is believed that the interaction of $Zr_4(OPr^n)_{16}$ with an activated surface results in the condensation of the zirconium compound with the surface and elimination of at least one equivalent of propanol, thus binding the metal alkoxide to the surface. The alkoxide is highly reactive, and this reactivity allows the metal alkoxide to be condensed and activated even at room temperature.

The condensation and activation of $Zr_4(OPr^n)_{16}$ onto semiconductor surfaces at temperatures lower than those conventionally used for metal oxide film formation helps to reduce the development of a second oxide film at the interface between the semiconductor and the metal oxide. For example, conventional high temperature processes involving silicon substrates can result in the formation of silica layers between the silicon and the metal oxide. Preferably, the condensation and activation of the metal alkoxide is performed at temperatures well below those used in vapor deposition or ALD processes. Preferably the condensation and activation are performed at temperatures below 150° C., more preferably at temperatures below 100° C., even more preferably at temperatures below 50° C., and even more preferably at temperatures of about 25° C.

The activation of a the modified surface of a semiconductor (i.e. having one or more layers of condensed $Zr_4$ $(OPr^n)_{16}$) serves to eliminate alkoxy groups from the surface. The activated surface can then be treated with additional $Zr_4(OPr^n)_{16}$, followed by another activation treatment. Continued repetition of the condensation and activation steps provides for a gradual buildup of zirconia on the semiconductor.

Activation of a modified surface layer of condensed $Zr_4(OPr^n)_{16}$ can be performed by a variety of methods, including for example irradiation, heating, vacuum treatment, hydrolysis, and treatment with an oxidizing agent. These methods can be used individually, or two or more of the methods can be used simultaneously or sequentially. For example, the modified surface can be subjected to UV irradiation, and this irradiation may be performed on the entire surface, or it may be performed in a pattern, such as a mask pattern as used in conventional semiconductor processing. In another example, the semiconductor containing the modified surface can be heated to thermally eliminate alkoxy groups. If the activation is performed by heating, it is preferred that the temperature be maintained below 150° C. In another example, the semiconductor containing the modified surface can be vacuum treated by subjecting the semiconductor to a reduced pressure environment. For example, the semiconductor can be vacuum treated by holding it under a pressure of 10 mm Hg or lower, preferably of 1 mm Hg or lower, and more preferably of 0.1 mm Hg or lower.

Activation of a modified surface layer of condensed $Zr_4(OPr^n)_{16}$ can also be performed by contacting the surface with a reagent. In one example, the modified surface can be contacted with water, or with a liquid mixture containing water, to hydrolyze the surface. In another example, the modified surface can be contacted with one or more oxidizing agents. Oxidizing agents include, for example, salts of sodium, potassium, ammonium, or phosphonium with chlorates, perchlorates, perbromates, periodates, sulfates, persulfates ($S_2O_8^{-2}$), or monopersulfates ($HSO_5^{-1}$). Specific examples of oxidizing agents include $KIO_4$, $NaIO_4$, $KHSO_5$, $NaHSO_5$, $(NH_4)HSO_5$, $(NH_4)_2S_2O_8$, $K_2S_2O_8$, $Na_2S_2O_8$, $KClO_4$, $NaClO_4$, and $NH_4ClO_4$, $H_2O_2$, benzoyl peroxide, di-t-butyl peroxide, and sodium peroxide. Preferably the oxidizing agent does not contain metals that could be difficult to remove from the surface, contaminating the zirconia layer. Oxidizing agents can be dissolved or dispersed in a liquid, such as an aqueous liquid or an anhydrous inert solvent. Examples of inert solvents for oxidizing agents include methyl cyclohexane, toluene, benzene, heptane, and pentane.

The activation step is preferably a hydrolysis of the modified surface through contact with an aqueous liquid. An aqueous liquid refers to a liquid mixture containing water, and can contain other solvents and/or reagents that can facilitate the controlled activation of the surface. More preferably, the hydrolysis liquid is an aqueous liquid containing n-propanol, and even more preferably has a water to propanol ratio of about 1:4. Without wishing to be bound by any theory of operation, it is believed that introduction of water to the system results in hydrolysis of other Zr—O—C bonds, with the elimination of additional propanol and the formation of Zr—OH bonds. These hydroxyl groups (—OH) are thus believed to be available for condensation with additional $Zr_4(OPr^n)_{16}$ to form Zr—O—Zr bonds.

The surface of the substrate can be rinsed after both the condensation and the activation procedures. For example, the surface may be rinsed with an inert solvent after a deposition of the zirconium alkoxide to ensure that only zirconium alkoxide which is bound to the surface remains. In another example, the surface may be rinsed with propanol after an activation step involving hydrolysis to assist in removing any residual water. After the hydrolysis and rinsing, the structure may be dried, optionally under vacuum conditions, to reduce the amount of reactive water or alcohol that could prematurely react with the metal alkoxide.

The thickness of the final metal oxide layer formed is dependent on the number of cycles of condensation and activation preformed. For example, a single cycle of condensation and activation, optionally followed by a heat treatment step, could be used to form an extremely thin layer of zirconia. To form metal oxide films that are useful as insulating or dielectric layers in semiconductor structures or semiconductor devices, it is preferred to use two or more cycles. In other preferred embodiments, the number of condensation and hydrolysis cycles performed may be four or more, ten or more, fifteen or more, or twenty or more.

Once a sufficient amount of zirconium has been deposited through condensation and activation cycles, the semiconductor structure can be heat treated. Preferably the semiconductor structure is heat treated at a temperature of at least 100° C., more preferably at a temperature of at least 300° C., more preferably still at a temperature of at least 600° C. Preferably the heat treatment is performed for at least 10 minutes, more preferably is performed for at least 20 minutes, and more preferably still is performed for at least 30 minutes. The heat treatment may be performed in an inert atmosphere, such as an argon atmosphere, and may also be performed under vacuum conditions (i.e. 10 mm Hg or less).

Figure 5:
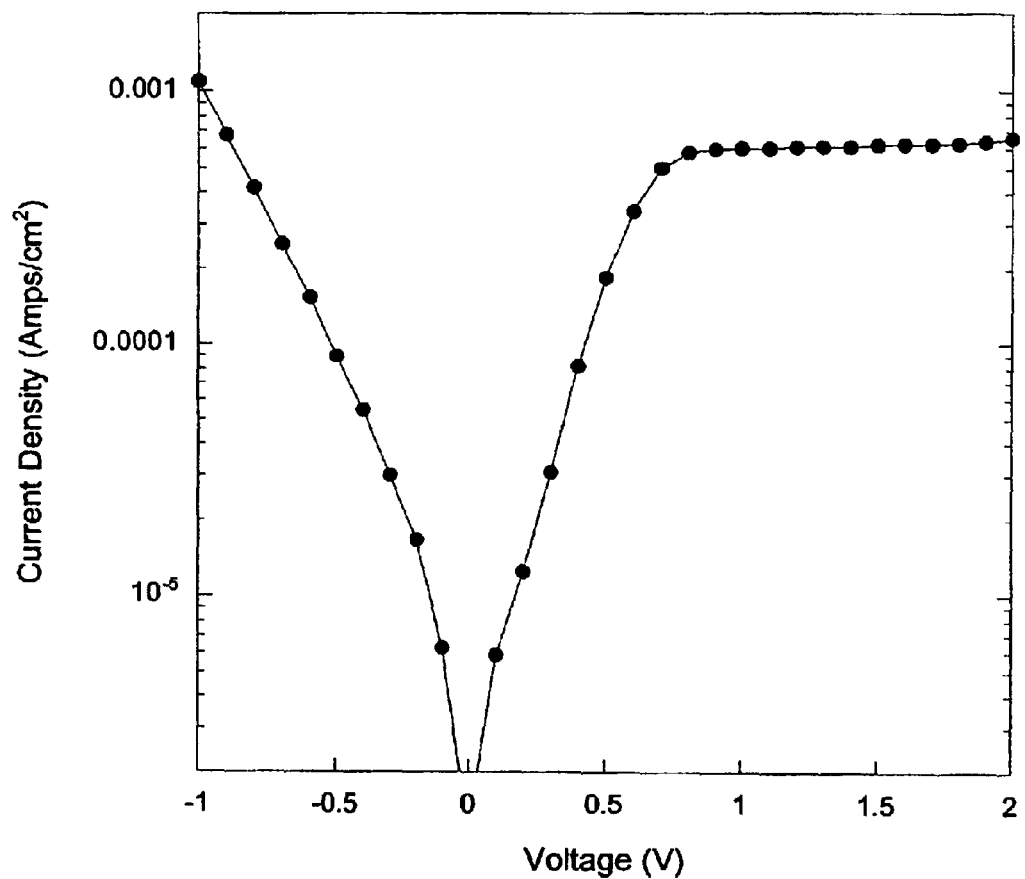
FIG. 5 is a graph of current density versus voltage for a metal oxide semiconductor (MOS) capacitor having the structure: Au/zirconia/p-Si(111)/Au.
Figure 6:
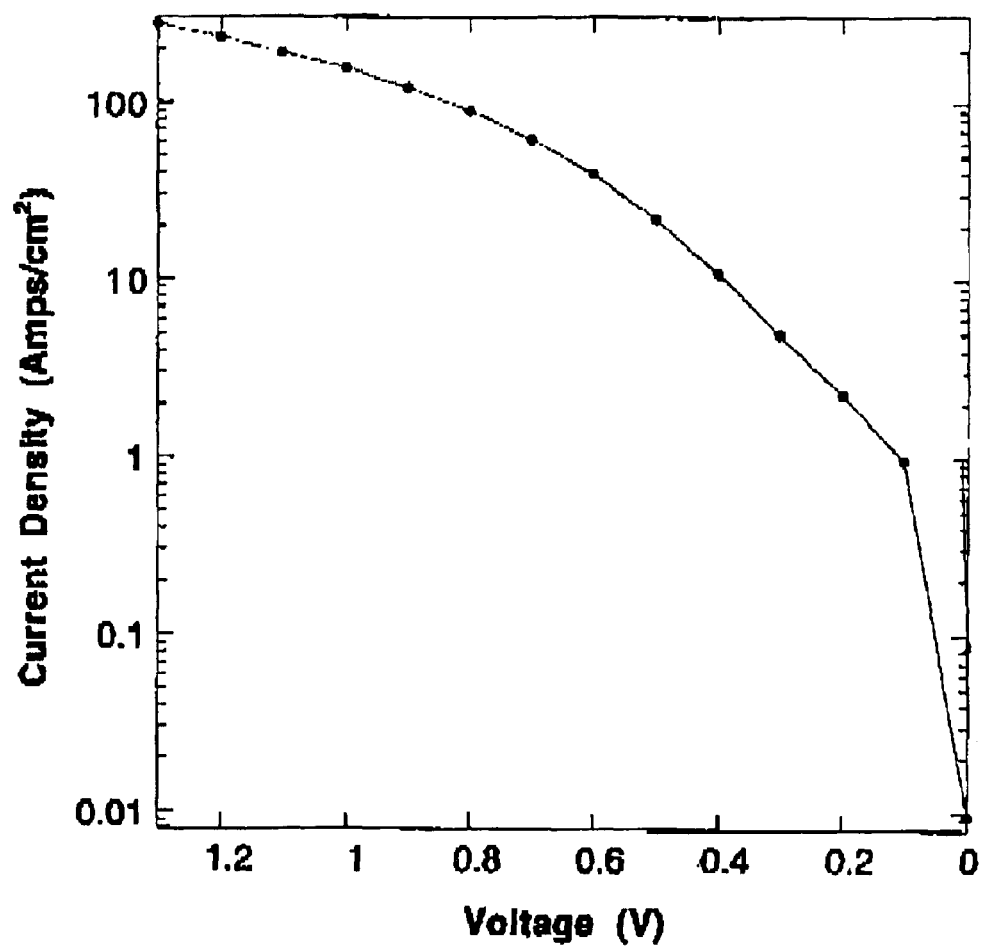
FIG. 6 is a graph of current density versus voltage for the structure: Au/silica/p-Si(111)/Au.

Metal oxide films on semiconductors may be characterized by parameters including equivalent oxide thickness and leakage current. The equivalent oxide thickness is the thickness of a film of silica that would be required to provide the same capacitance as provided by the metal oxide film. A metal oxide film with a dielectric constant (K) higher than silica can provide the same capacitance as a silica film having a smaller thickness. Because the high-K dielectric film can have an increased thickness, the leakage current at a given voltage is smaller compared to a silica film having the same capacitance. When forming zirconia films on silicon according to the present invention, dielectric films can be formed having equivalent oxide thicknesses of 2 nanometers (nm) or smaller, but with leakage currents of 0.002 amperes per square centimeter ($A/cm^2$) or lower when subjected to 1.0 volt. More preferably, dielectric films can be formed having equivalent oxide thicknesses of 2 nanometers (nm) or smaller, with leakage currents of 0.001 $A/cm^2$ or lower when subjected to 1.0 volt. The leakage current as a function of applied voltage for a semiconductor structure of the present invention is illustrated in FIG. 5. In contrast, the leakage current as a function of voltage for a semiconductor with a silica film rather than a metal oxide film of the present invention is illustrated in FIG. 6.

Figure 9:
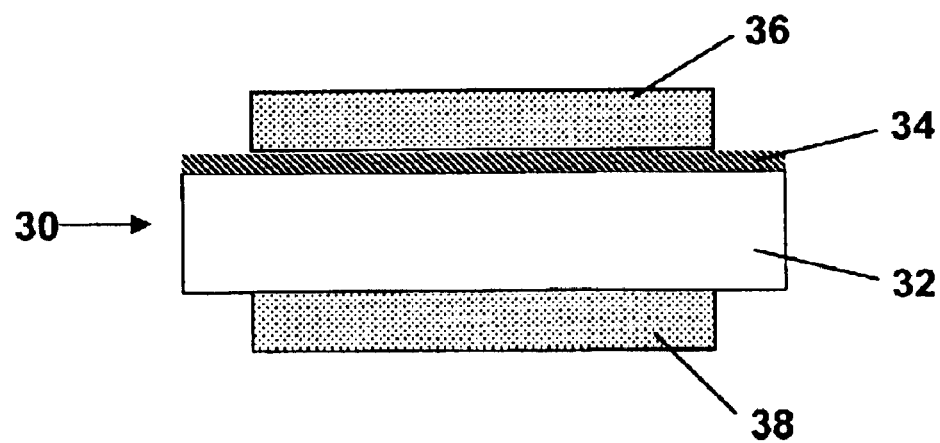
FIG. 9 is a diagram of a MOS capacitor.

Another parameter for characterizing the quality of metal oxide films is the amount of stretchout in a graph of capacitance versus voltage. The measurement of capacitance versus voltage (C-V) is possible when the semiconductor coated with the metal oxide film on one surface is sandwiched between conductive contacts, a structure referred to as a metal oxide semiconductor (MOS) capacitor. Referring to FIG. 9, an example of a MOS capacitor 30 has a semiconductor substrate 32 with a zirconia layer 34. A conductive material is present on the semiconductor as ohmic contact 38 and on the zirconia layer as contact 36. Conductive materials that can be used as the contacts in a MOS capacitor include conductive metals and conductive non-metals. Preferably the conductive contacts are formed of conductive metals such as aluminum, copper and gold. The measured capacitance is reported in capacitance per unit area (i.e. per $cm^2$), where the area of contact between the zirconia layer and contact 36.

Figure 7:
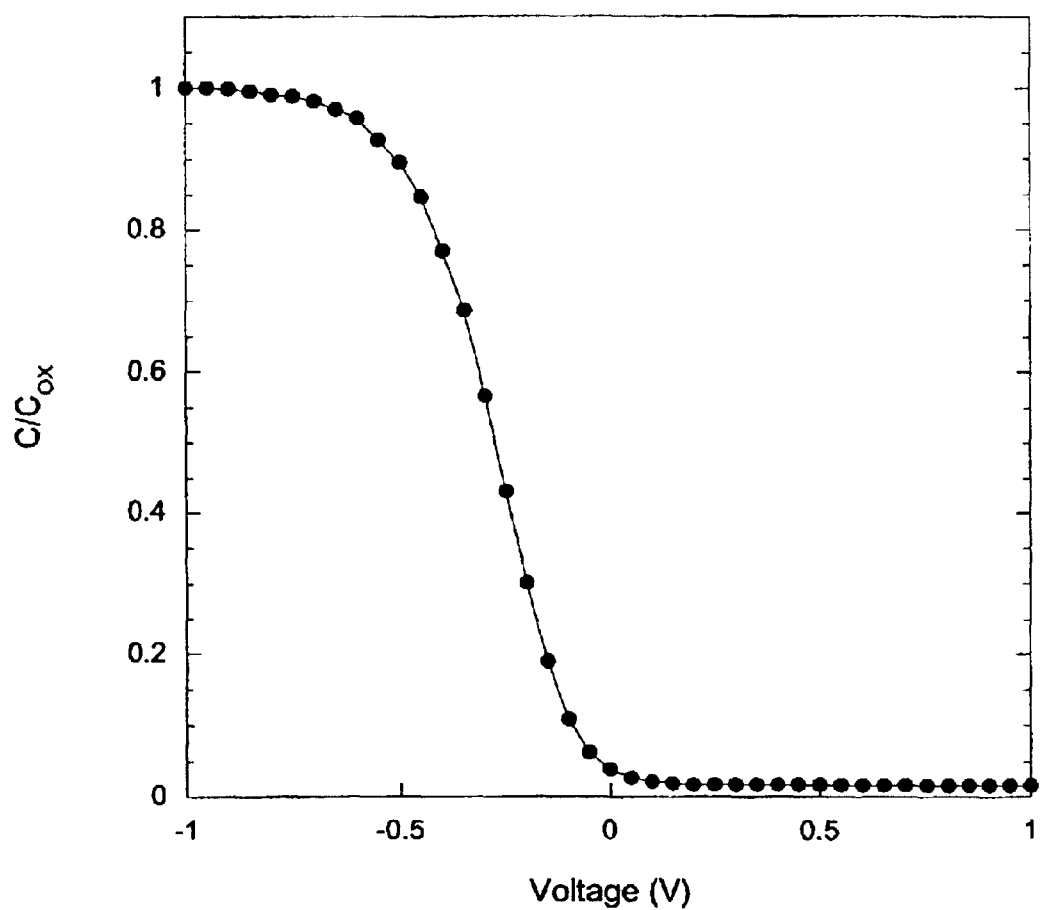
FIG. 7 is a graph of normalized capacitance density versus voltage, performed at 1 MHz, for a metal oxide semiconductor (MOS) capacitor having the structure: Au/zirconia/p-Si(111)/Au.

The stretchout for a MOS capacitor is defined as the difference in applied voltage required to reduce the capacitance from 95% of its maximum value to 5% of its maximum value. The stretchout region is illustrated in FIG. 7 as the drastic decrease in capacitance from −0.6 volts to 0 volts. Between these voltages, the capacitance decreases from 95% of its maximum value at −1 volt to 5% of the maximum value. Conventional high-K metal oxide films exhibit a stretchout of 1.5 volts or greater. Referring to FIG. 7, zirconia films of the present invention exhibit a stretchout of 0.6 volts. Preferably, the stretchout of the metal oxide films of the present invention is less than 1.5 volts, more preferably less than 1 volt, and even more preferably less than 0.7 volt. It is believed that the stretchout of a metal oxide film in a MOS capacitor is due to surface irregularities. (Nicollian, E. H. et al. *MOS (Metal Oxide Semiconductor) Physics And Technology*, Wiley-Interscience, (2003) chapter 6)

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile. The related processing steps, polishing, cleaning, and deposition steps, for making semiconductor devices are well known to those of ordinary skill in the art, and are also described in *Encyclopedia of Chemical Technology*, Kirk-Othmer, Volume 14, pp. 677–709 (1995); *Semiconductor Device Fundamentals*, Robert F. Pierret, Addison-Wesley, 1996; Wolf, *Silicon Processing for the VLSI Era*, Lattice Press, 1986, 1990, 1995 (vols 1–3, respectively), and *Microchip Fabrcation* 4th. edition, Peter Van Zant, McGraw-Hill, 2000.

EXPERIMENTAL

Materials and Methods

Tetra-n-propyl zirconate was purchased from ALDRICH CHEMICAL (Milwaukee, Wis.) as a 70% solution by weight in n-propanol. Molecular sieves (3 Å Linde type A, GRACE DAVISON, Columbia, Md.) were activated by heating at 250° C. for at least 24 hours and cooling under vacuum. Solvents such as HPLC grade n-heptane, HPLC grade n-pentane, methylcyclohexane, and toluene were obtained from FISHER SCIENTIFIC (Suwanee, Ga.) or ALDRICH, and were dried over activated molecular sieves, refluxed over Na, and freshly distilled prior to use. Anhydrous methylcyclohexane (ALDRICH) was refluxed over molten sodium, freshly distilled, and degassed using three freeze-pump-thaw cycles or sparging with Ar gas (S. J. SMITH) for at least 30 min prior to use. Anhydrous n-propanol (ALDRICH) was sparged with Ar gas for at least 30 min prior to use. Diethylether and benzene (FISHER SCIENTIFIC) were dried over activated molecular sieves, refluxed over Na/benzophenone, and freshly distilled prior to use. Cyclohexane-$d_{12}$ (CAMBRIDGE ISOTOPE LABORATORIES, Andover, Mass.) was dried over activated molecular sieves for at least 24 hours prior to use and subsequently distilled. Methylcyclohexane-$d_{14}$ was dried over Na/K alloy for 24 hours, degassed using three freeze-pump-thaw cycles, and distilled from Na/K alloy. All other solvents were dried over activated molecular sieves for at least 24 hours prior to use.

For measuring the electrical properties of the thin films, silicon(111) wafer strips were cut from single-side polished p-type, CZ grown wafers with a resistivity of 3 to 6 ohm-centimeters (MEMC ELECTRONIC MATERIALS). For other analytical measurements, n-type silicon wafer strips were also used. All water ($H_2O$) used was ultrapure water (18 Mohm-cm), which was obtained directly from a BARNSTEAD NANOPURE II filtration system with a 4-module cartridge configuration and 0.2 $\mu$m pore size final filter. Acetone, 2-propanol (FISHER SCIENTIFIC), 30% ammonium hydroxide, 30% hydrogen peroxide (J. T. BAKER), 38% hydrochloric acid (CORCO), and 40% ammonium fluoride were electronic grade, and 1,1,1-trichloroethane (ALDRICH) was reagent grade.

Tetra-n-propyl zirconate is an extremely moisture-sensitive material, and all manipulations were carried out under an argon or nitrogen atmosphere using standard Schlenk and dry box techniques.

All glass and TEFLON materials used in the course of cleaning, etching, and storing silicon(111) wafer strips were cleaned in an 80° C. bath of 5:1:1 $H_2O$:30% $NH_4OH$:30% $H_2O_2$ by volume for 1 h and rinsed for 30 sec in a flowing stream of $H_2O$. These materials included fused quartz and conventional glassware as well as TEFLON utensils, including containers, tubing, and tweezers. The glassware used during the film deposition process was immersed in a saturated ethanolic KOH solution, rinsed with dilute HCl, rinsed with deionized water, and oven-dried for 12 hours at 120° C. The glassware used for synthesis of the tetra-n-propyl zirconate was then thoroughly flame-dried before use by passing the flame from a Bunsen burner over the entire surface of the flask under vacuum (ca. $10^{-2}$ mm Hg). Water vapor was observed upon contact of the flame with the glass, and glassware was heated for approximately three minutes until no further water vapor was visible. The flask was then allowed to cool under vacuum. TEFLON stopcocks were employed instead of glass stopcocks, and TEFLON stoppers were employed instead of glass or rubber stoppers.

Preparation of Tetra-n-Propyl Zirconate ($Zr_4(OPr^n)_{16}$)

A 250 mL, two-neck round bottom flask with ground glass joints was charged with 100 mL of a 70 wt % solution of partially-hydrolyzed tetra-n-propyl zirconate in n-propanol. The flask was then joined to a nitrogen inlet and a distillation apparatus constructed from a 24 mm i.d. Vigreux reflux column 20.3 cm in length, a distillation head with a thermometer, and a Liebig condenser with a jacket length of 20.0 cm. Components of the distillation apparatus were not connected by ground-glass joints but were instead integrated into a single piece of glassware. A 100 mL single-neck receiving flask was joined to the still body by an elbow fitted with a nitrogen/vacuum inlet. All ground glass joints were sealed with silicone grease and secured with copper wire.

n-Propanol was removed from the partially-hydrolyzed tetra-n-propyl zirconate solution under nitrogen by heating the distillation flask in a silicone oil heating bath and collecting all material that distilled at temperatures less than 100° C. at ambient pressure. The waxy yellow solid remaining in the distillation flask was allowed to cool to room temperature.

Tetra-n-propyl zirconate was distilled under vacuum from the same distillation flask used for the removal of propanol, but using a different distillation apparatus suited for higher temperatures and lower pressures. A heating bath containing 40 wt % $NaNO_2$, 7 wt % $NaNO_3$, and 53 wt % $KNO_3$ at 37° C. was employed. The distillation flask was fitted with a still body identical to the one described above except that the Liebig condenser was replaced with a simple, 1.25 cm i.d. glass condenser. A cow receiver equipped with a nitrogen/vacuum inlet and fitted with one 50 mL and two 100 mL Schlenk flask receivers spaced 45° apart was attached to the still body. All ground-glass joints were sealed with KRYTOX® LVP fluorinated grease (70% perfluoroalkyl ether, 30% polytetrafluoroethylene, DUPONT, Wilmington, Del.) and secured with copper wiring. A thermocouple probe was attached to the surface of the condenser, which was subsequently wrapped with heating tape insulated with braided fibrous glass, and the still body and condenser were heavily insulated with glass wool and aluminum foil. The system was evacuated to ca. $10^{-2}$ mm Hg pressure, the condenser was heated to ca. 175° C., and finally, the temperature of the heating bath was raised to 290° C.

Three distinct distillation fractions were observed as the temperature at the distillation head was allowed to rise to 270° C., and these three fractions were collected as follows. Less than 3 mL of a yellow oil distilled between 185° C. and 220° C., the precise amount obtained depending upon the purity of the crude material. About 40 g of analytically pure tetra-n-propyl zirconate was collected between 225° C. and 245° C. as a clear, colorless liquid that solidified immediately upon contact with the collection flask. Finally, about 10 g of a third fraction was collected between 250 and 270° C. as a waxy white or slightly yellow solid. About 20 g of the crude material remained in the distillation pot. Extreme caution was exercised to maintain the condenser at an elevated temperature throughout the distillation, since solidification of the distillate in the condenser at lower temperatures would generate a closed and hence extremely hazardous system.

Material in the distillation pot could not be raised to temperatures above about 200° C. for longer than about 40 minutes. If the distillation was carried out more slowly, a distinct second distillation fraction was not observed, and the tetra-n-propyl zirconate collected at elevated distillation temperatures was seriously contaminated.

Tetra-n-propyl zirconate is highly soluble in diethylether, n-propanol, toluene, benzene, methylene chloride, 1,2-dichloroethane, and hydrocarbons such as n-heptane, n-pentane, and methylcyclohexane. It can be crystallized from n-heptane, n-pentane, toluene, methylene chloride, and 1,2-dichloroethane.

Analysis of Tetra-n-Propyl Zirconate ($Zr_4(OPr^n)_{16}$)

Both 500 MHz $^1H$ and 125.6 MHz $^{13}C\{^1H\}$ NMR spectra were measured on a UNITY 500 spectrometer (VARIAN, Palo Alto, Calif.), and those recorded at 750 and 188.6 MHz, respectively, were measured on a UNITY INOVA 750 spectrometer (VARIAN). Gradient-enhanced $^1H$-$^1H$ COSY experiments, gradient phase-sensitive $^1H$-$^{13}C$ heteronuclear multiple-quantum coherence (HMQC) experiments, and $^{13}C$ inversion-recovery experiments were performed using standard pulse programs. Chemical shifts were internally referenced to tetramethylsilane ($\delta$=0.00). NMR samples were typically prepared by distilling 0.75 mL of deuterated solvent into a 5 mm o.d. NMR sample tube containing ca. 45 mg tetra-n-propyl zirconate. The tube was then flame-sealed under vacuum. Elemental analysis was performed by the University of Illinois Microanalytical Service Laboratory.

Analytical calculation for $Zr_4O_{16}C_{48}H_{112}$ in weight percent is as follows: C, 44.00; H, 8.62; Zr, 27.85. Weight percentages measured were as follows: C, 43.68; H, 8.87; Zr, 28.33.

$^1H$ NMR (500 MHz, cyclohexane-$d_{12}$,22° C.): $\delta$ 4.20–3.90 (16H, m, —$OCH_2CH_2CH_3$), 2.13 (2H, br sext, J=7.7 Hz, —$OCH_2CH_2CH_3$), 1.90 (2H, br m, —$OCH_2CH_2CH_3$), 1.80 (2H, br m, —$OCH_2CH_2CH_3$), 1.67 (4H, sext, J=7.4 Hz, —$OCH_2CH_2CH_3$), 1.60 (6H, br m, —$OCH_2CH_2CH_3$), 0.94 (9H, t, J=7.4 Hz, —$OCH_2CH_2CH_3$), 0.90 (6H, t, J=7.5 Hz, —$OCH_2CH_2CH_3$), 0.86 (6H, t, J=7.6 Hz, —$OCH_2CH_2CH_3$), 0.83 (3H, t, J=7.5 Hz, —$OCH_2CH_2CH_3$);

$^1H$ NMR (750 MHz, methylcyclohexane-$d_{14}$, -20° C.): $\delta$ 3.91–4.15 (16H, m, —$OCH_2CH_2CH_3$), 2.12 (2H, br sext, —$OCH_2CH_2CH_3$), 1.89 (2H, br m, —$OCH_2CH_2CH_3$), 1.78 (2H, br m, —$OCH_2CH_2CH_3$), 1.66 (4H, sext, J=7.3 Hz, —$OCH_2CH_2CH_3$), 1.59 (4H, sext, J=7.3 Hz, —$OCH_2CH_2CH_3$), 1.58 (2H, sext, J=7.3 Hz, —$OCH_2CH_2CH_3$), 0.95 (6H, t, J=7.3 Hz, —$OCH_2CH_2CH_3$), 0.94 (3H, t, J=7.3 Hz, —$OCH_2CH_2CH_3$), 0.90 (6H, t, J=7.3 Hz, —$OCH_2CH_2CH_3$), 0.87 (6H, t, J=7.3 Hz, —$OCH_2CH_2CH_3$), 0.83 (3H, t, J=7.3 Hz, —$OCH_2CH_2CH_3$), $^{13}C\{^1H\}$ NMR (125.6 MHz, cyclohexane-$d_{12}$,22° C.): $\delta$ 73.55 (1C, —$OCH_2CH_2CH_3$), 73.49 (2C, —$OCH_2CH_2CH_3$), 73.25 (2C, —$OCH_2CH_2CH_3$), 72.41 (3C, —$OCH_2CH_2CH_3$), 28.86 (2C, —$OCH_2CH_2CH_3$), 28.47 (1C, —$OCH_2CH_2CH_3$), 27.92 (2C, —$OCH_2CH_2CH_3$), 26.85 (2C, —$OCH_2CH_2CH_3$), 24.30 (1C, —$OCH_2CH_2CH_3$), 10.96 (3C, —$OCH_2CH_2CH_3$), 10.60 (2C, —$OCH_2CH_2CH_3$), 10.19 (1C, —$OCH_2CH_2CH_3$), 10.00 (2C, —$OCH_2CH_2CH_3$), $^{13}C\{^1H\}$ NMR (188.6 MHz, methylcyclohexane-$d_{14}$, -20° C.): $\delta$ 73.28 (—$OCH_2CH_2CH_3$), 73.13 (—$OCH_2CH_2CH_3$), 73.06 (—$OCH_2CH_2CH_3$), 72.07 (—$OCH_2CH_2CH_3$), 72.03 (—$OCH_2CH_2CH_3$), 28.68 (—$OCH_2CH_2CH_3$), 28.27 (—$OCH_2CH_2CH_3$), 27.74 (—$OCH_2CH_2CH_3$), 26.70 (—$OCH_2CH_2CH_3$), 23.96 (—$OCH_2CH_2CH_3$), 11.03 (—$OCH_2CH_2CH_3$), 11.01 (—$OCH_2CH_2CH_3$), 10.64 (—$OCH_2CH_2CH_3$), 10.39 (—$OCH_2CH_2CH_3$), 10.14 (—$OCH_2CH_2CH_3$).

Preparation of H—Si(111)

Samples of Si(111) were cut from a single-side polished wafer into 1×1 $cm^2$ strips. The sized Si(111) strips were sonicated for 5 minutes in 1,1,1-trichloroethane heated to 60° C., rinsed with cascading water for 5 minutes, sonicated for 5 minutes in acetone heated to 50° C., rinsed with cascading water for 5 minutes, sonicated for 5 minutes in isopropanol heated to 80° C., and rinsed with cascading water for 5 minutes. Next, the strips were immersed for 15 minutes in a solution of 5:1:1 $H_2O$:30% $NH_4OH$:30% $H_2O_2$ by volume heated to 80° C., rinsed with cascading water for 5 minutes, and then immersed for 15 minutes in a solution of 5:1:1 $H_2O$:12 M HCl:30% $H_2O_2$ by volume heated to 80°

C. After rinsing with cascading water for 5 minutes, the Si(111) samples were stored in water until needed. To obtain hydrogen-terminated Si(111) surfaces, these Si(111) samples were removed from the water, immersed in a 40% NH$_4$F solution for 5 minutes, and rinsed for 30 seconds in running water. The wafer strips were blown dried of any remaining water with the use of a brisk flow of Ar gas.

EXAMPLE 1

Deposition of Metal Oxide Films on a Semiconductor

Zirconia films were grown on either freshly prepared H—Si(111) or pretreated Si(111). The pretreated wafers were prepared by immersing freshly prepared H—Si(111) wafers in a 1:4 H$_2$O:n-propanol solution for 90 minutes. Zirconia films were grown by immersing the Si(111) wafer into a solution containing Zr$_4$(OPr$^n$)$_{16}$ is and H$_2$O. Solutions containing Zr$_4$(OPr$^n$)$_{16}$ were prepared in an inert atmosphere environment by dissolving Zr$_4$(OPr$^n$)$_{16}$ (150 mg, 0.115 mmol) into methylcyclohexane (15 mL) in a 50 mL glass beaker with a screw top. Solutions containing H$_2$O were prepared by mixing H$_2$O and n-propanol in a 1:4 ratio by volume in a 50 mL glass beaker.

Film deposition was achieved as follows. The H—Si(111) or pretreated Si(111) sample was first brought into an inert atmosphere environment and then immersed in the methylcyclohexane solution containing Zr$_4$(OPr$^n$)$_{16}$ for at least 10 minutes with the glass beaker screw top secured to minimize evaporation and contamination. After the allotted time, the Si(111) sample was removed and immediately rinsed 3 times with methylcyclohexane, still inside an inert atmosphere environment. When the sample had completely dried after the last rinse, the sample was removed from inside the inert atmosphere environment and was immediately immersed into the 1:4 H$_2$O:n-propanol solution for 30 seconds. After the Si(111) sample was removed from this solution, the sample was dried for 30 seconds using a brisk Ar flow. Film growth continued when the Si(111) sample was brought back into the inert atmosphere environment for an additional cycle. The amount of zirconia deposited was adjusted by repeated application of the deposition procedure just described. Each such application is referred to herein as a deposition cycle.

The zirconia films on silicon were heat treated in a 1-inch diameter fused quartz tube using a single zone tube furnace (LINDBERG/BLUE M). The samples were heat treated at 600° C. for 30 minutes under a flow of Ar gas and allowed to cool to room temperature under Ar.

Rutherford Backscattering Spectrometry Analysis of Metal Oxide Film on a Semiconductor Silicon samples with zirconia films were analyzed using a Van der Graaf accelerator with 2.0 meV $^4$He$^+$ ions and spot diameter of 2 mm. The RBS chamber was maintained at a pressure of ~10$^{-6}$ Torr during the experiment. The angle from the beam to the detector was 30° with both the beam and detector positioned 15° from the sample surface normal. The stage was constantly rotated around the surface normal throughout the experiment to minimize the likelihood of channeling, which may inadvertently occur with crystalline materials. Acquisition times of about 30 minutes were typically used.

Because the zirconia films were not excessively thick, the density of Zr atoms on Si(111) was calculated from the ratio of the expressions for the Si height of the step edge and area of the Zr peak:

$$(Nt)_{Zr} = (A_{Zr}/H_{Si,0})(\sigma_{Si}/\sigma_{Zr})(E/[\epsilon_0])$$

where $(Nt)_{Zr}$ is the areal concentration of Zr in atoms per cm$^2$ at the surface, $A_{Zr}$ is the area in counts-channel of the Zr peak, $H_{Si,0}$ is the height in counts of the Si substrate step edge due to the backscattered He ion from the topmost layer of the surface, $\sigma_{Si}$ and $\sigma_{Zr}$ are the average differential scattering cross sections between the He ions and Si or Zr evaluated at the incident energy and backscattering angle from the incoming beam to the detector, E is the energy width of a channel, and $[\epsilon_0]$ is the stopping cross section factor evaluated at the surface for a given scattering geometry. The area of the Zr peak was calculated using a Gaussian fit for the Zr peak and a polynomial equation fit for the background due to post pile-up. Both $\sigma_{Si}$ and $\sigma_{Zr}$ were calculated to have values of 2.816×10$^{-25}$ cm$^{-2}$ and 2.375× 10$^{-24}$ cm$^2$, respectively, from the Rutherford scattering equation where the incident energy was 2.0 MeV and the backscattering angle was 150°. The energy width of a channel, E, was derived from the channel positions of the Si edge and Zr peak in the spectrum against the known energy values according to their kinematic factors for a 2.0 MeV beam. Finally, $[\epsilon_0]$ has a value of 9.0999×10$^{-14}$ eV/(atoms/cm$^2$) and was calculated using the $^{14}$Si electronic stopping power curve equation and the surface energy approximation. See, for example, Chu, W.-K., Mayer, J. W., Nicolet, M.-A. *Backscattering Spectrometry*; Academic Press: New York, 1978; and Zeigler, J. F. *Helium: Stopping Powers and Ranges in All Elemental Maffer*, Pergamon: New York, 1977; Vol. 4.

Figure 3:
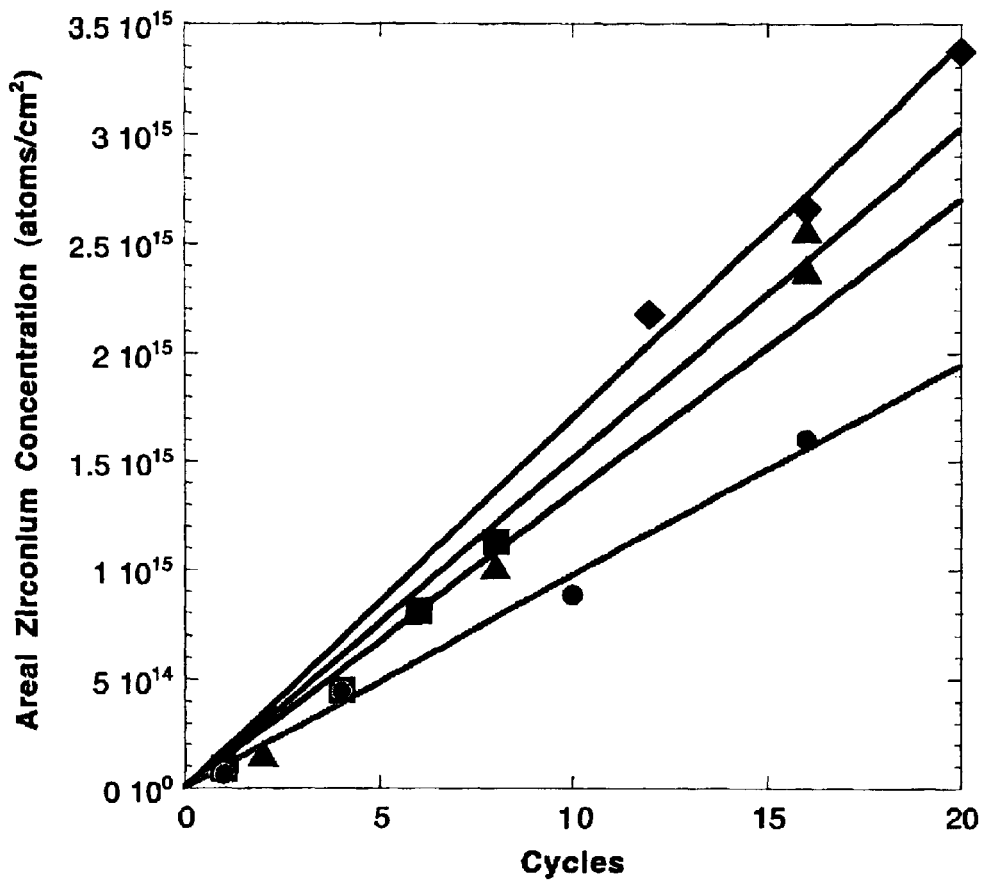
FIG. 3 is a graph of areal zirconium concentration versus condensation-activation cycles for four samples as measured by Rutherford Backscattering Spectrometry (RBS).
Figure 4A:
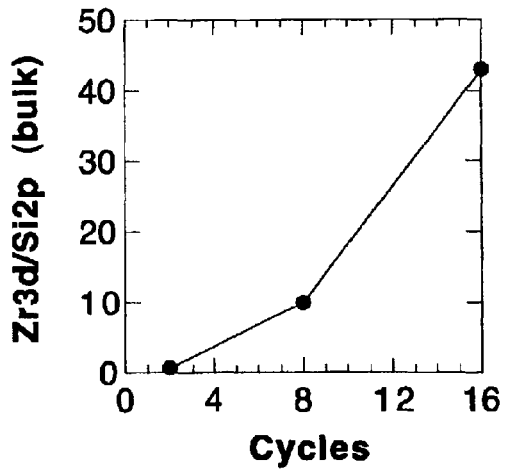
FIGS. 4a–d are graphs of peak area ratios versus condensation-activation cycles as measured by high-resolution X-ray photoelectron spectroscopy (XPS).
Figure 4B:
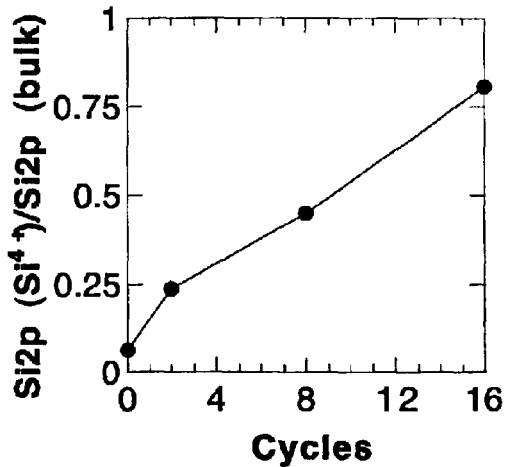
Figure 4C:
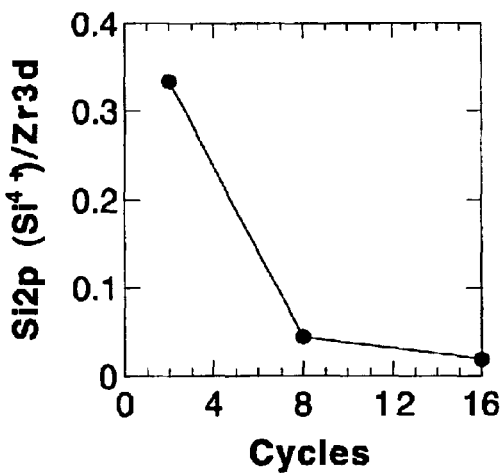
Figure 4D:
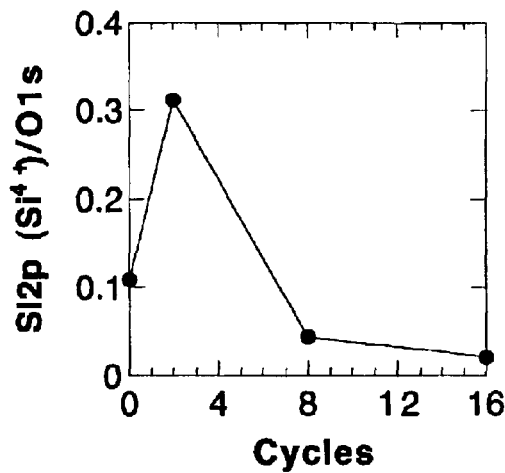

Graphs of areal Zr concentration versus number of deposition cycles is shown in FIG. 3 for four different series of samples, where each set of points was measured from films deposited on the same substrate. These samples were obtained by breaking off samples of the silicon wafer in the course of the deposition process after a given number of deposition cycles were completed. These results show how the deposition rate varied from 9.7×10$^{13}$ to 1.7×10$^{14}$ Zr atoms/cm$^2$ per deposition cycle.

XPS Analysis of Metal Oxide Film on a Semiconductor

X-ray photoelectron spectra were measured using a XPS (PHYSICAL ELECTRONICS PHI 5400) spectrometer equipped with a dual Mg/Al Kα X-ray source as well as a monochromatic Al Kα X-ray source consisting of a quartz crystal monochromator, a concentric hemispherical analyzer, and a multichannel detector. The angle between the dual Mg/Al Kα X-ray source and the detector was locked at 54.7°, while the angle between the monochromatic Al Kα X-ray source and the detector was locked at 90°. The samples were exposed to air for minimum periods of time during transport to the XPS facility. The pressure inside of the XPS analytical chamber remained below 2×10$^{-8}$ Torr during data collection. The Si(111) wafer was mounted with either the [211] or [011] directions parallel to the plane of incidence and oriented toward the detector. The angle from the detector to the surface normal of the wafer piece was adjusted by rotating the sample stage.

X-ray photoelectron spectra were collected either in a survey mode, using a pass energy of 178.95 eV (1.0 eV/step) with a binding energy range of 1100 to 0 eV, or in a high-resolution mode, using a pass energy of 35.75 eV (0.1 eV/step, 100 msec/step) with a binding energy range focusing on the regions of the Zr 3d, C 1s, O 1s, and Si 2p photoemission peaks. The spectra obtained in the high-resolution mode were standardized to the hydrocarbon peak at 285 eV in the C 1s region.

Four different elements were identified from the survey scans from their characteristic binding energies: zirconium, silicon, carbon and oxygen. In high resolution spectra, distinct peaks could be resolved at 182.3, 102, and 99 eV and were assigned to Zr 3d electrons from $Zr^{4+}$ in zirconia, to Si 2p electrons from $Si^{4+}$ in silica, and to Si 2p electrons from $Si^0$ in elemental (bulk) silicon, respectively, by comparison with published reference values. See, for example, Moulder, J. F.; Stickle, W. F.; Sobol, P. E.; Bomben, K. D. *Handbook of X-ray Photoelectron Spectroscopy*; Perkin-Elmer: Eden Prairie, Minn., 1992. The intensity of the peak assigned to $Si^{4+}$ increased relative to the intensity of the peak assigned to elemental (bulk) silicon after heat treating.

The relative intensities of selected XPS peaks are plotted in FIG. 4 as a function of the number of deposition cycles, where each set of data was measured from films deposited on the same substrate as described above for FIG. 3. The plot of Zr 3d/Si 2p (bulk) ratios versus number of cycles reflects the increasing amounts of zirconia deposited as the number of deposition cycles was increased. The amount of silica formed appeared to increase during film growth according to the observed increase in Si 2p ($Si^{4+}$)/Si 2p (bulk) ratios with increasing numbers of deposition cycles (FIG. 4*b*). Decreases in the Si 2p ($Si^{4+}$)/Zr 3d ratio (FIG. 4*c*) and the Si 2p ($Si^{4+}$)/O 1s ratio (FIG. 4*d*) with increasing number of deposition cycles suggests that silica was not uniformly distributed in the zirconia film but was instead concentrated near the silicon/zirconia interface.

EXAMPLE 2

Electrical Property Measurements of Metal Oxide Film on a Semiconductor

Metal oxide semiconductor (MOS) capacitors were fabricated by sputter deposition of 1000 Å thick Au contacts on the deposited zirconia film with a top electrode area of 58×58 $\mu m^2$. The backside ohmic contact was deposited after etching the oxide with dilute HF and was also 1000 Å thick. A magnetron sputtering system (AJA INTERNATIONAL) was employed to deposit Au films at a growth rate of 1–2 Å per second. The current-voltage (I–V) curves were measured using a HP 4140B pA meter. The capacitance-voltage (CHV) curves were measured using a HP 4284A impedence LCR meter at frequencies between 100 Hz and 1 MHz, usually reported at 100 kHz and 1 MHz for 0.05 V ac-oscillator strength.

A comparable metal-insulator-semiconductor (MIS) structure for gate oxide capacitor is usually used during testing of new materials for its convenience. The electrical response is similar to that of the polysilicon gate devices and the ease of fabrication facilitates obtaining data on the gate oxide material alone. The basic evaluation of an insulating layer consists of leakage current and capacitance measurements. See, for example, Degraeve, R.; Cartier, E.; Kauerauf, T.; Carter, R.; Pantisano, L.; Kerber, A.; Groeseneken, G. *MRS Bulletin* 2002, 27, 222. The capacitance-voltage (C-V) behavior of an MIS structure provides information on the dielectric properties of the insulating gate oxide as well as its interface with the metal and underlying Si substrate.

The leakage current density in accumulation at −1 V was in the range of $10^{-3}$ to $10^{-4}$ Amps/$Cm^2$ for the zirconia films on Si(111) grown after 12 to 20 deposition cycles. A typical current density-voltage is shown in FIG. 5. FIG. 6 shows the current density-voltage plot of the control sample where a H—Si(111) was immersed in alternating methylcyclohexane and $H_2O$:n-propanol solutions, rinsed with methylcyclohexane, blown dry with Ar for a total 16 cycles, and then heat treated for 30 minutes at 600° C. in Ar. An experimental procedure was used for a control sample processed by following the procedure described above for deposition of zirconia on H—Si(111) using 16 deposition cycles but replacing the solution of $Zr_4(OPr^n)_{16}$ in methylcyclohexane with neat methylcyclohexane. The current density observed at 1 V was at least $10^5$ times greater than the current density observed for zirconia films prepared under the same conditions using 16 deposition cycles.

Figure 8:
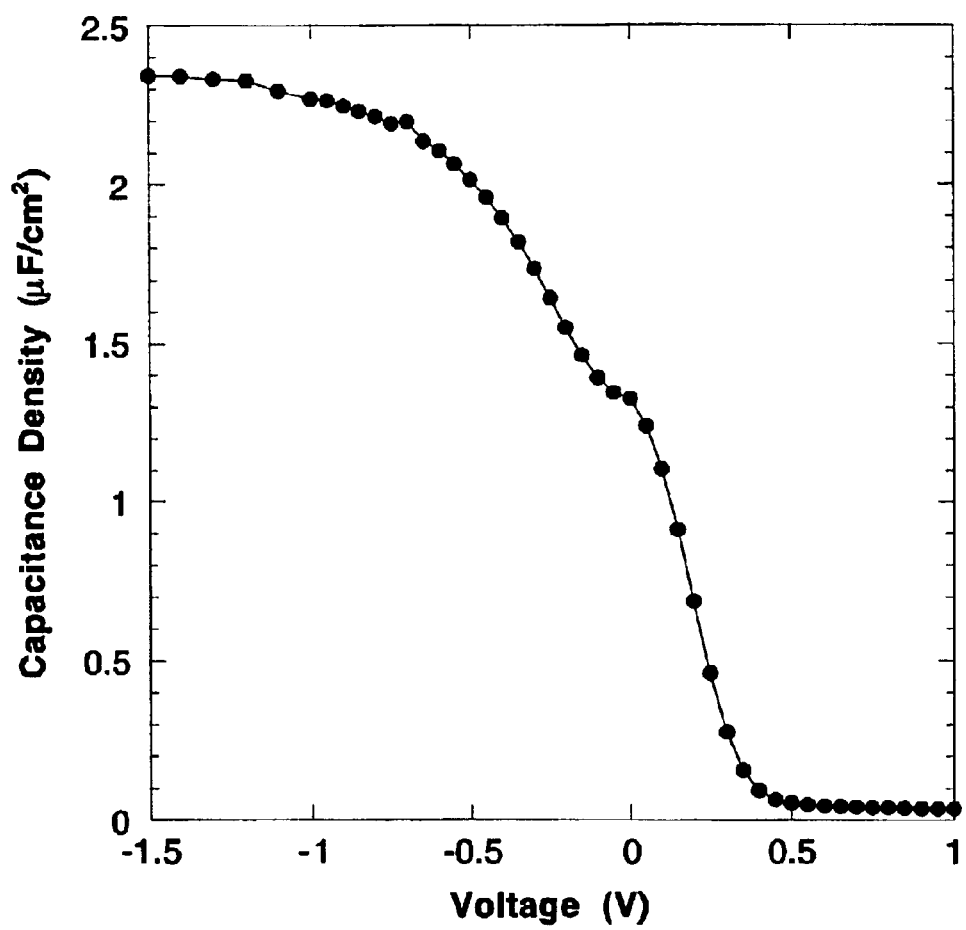
FIG. 8 is a graph of capacitance density versus voltage, performed at 100 kHz, for a metal oxide semiconductor (MOS) capacitor having the structure: Au/zirconia/p-Si(111)/Au.

FIG. 7 shows a C-V curve of a Si(111) with a zirconia film grown after 16 cycles and heat treated in Ar. At an applied voltage of 1.0 V and a frequency of 1 MHz, a capacitance density of 1.7 $\mu F/cm^2$ was achieved. The equivalent oxide thickness for the zirconia film was 2.0 nm. The capacitance density was slightly higher at lower frequencies, as seen in FIG. 8, but the distortion at the midway point of the C-V curve was more pronounced. Films with equivalent oxide thicknesses below 2 nm using the $Zr_4(OPr^n)_{16}$ precursor in methylcyclohexane were typically achieved, but the distortion was almost always present in the C-V curves and was most likely due to interface traps. See, for example, Schroder, D. K. *Semiconductor Material and Device Characterization*; Wiley: New York, 1990.

Although the invention has been described and illustrated with reference to specific illustrative embodiments thereof, it is not intended that the invention be limited to those illustrative embodiments. Those skilled in the art will recognize that variations and modifications can be made without departing from the true scope and spirit of the invention as defined by the claims that follow. It is therefore intended to include within the invention all such variations and modifications as fall within the scope of the appended claims and equivalents thereof.

What is claimed is:

1. A method of making a semiconductor structure, comprising:
   contacting a surface of a semiconductor with a liquid comprising $Zr_4(OPr^n)_{16}$ to form a modified surface;
   activating the modified surface; and
   repeating the contacting and activating to form a layer of zirconia on the semiconductor surface.

2. The method of claim 1, wherein the liquid comprising $Zr_4(OPr^n)_{16}$ is anhydrous.

3. The method of claim 2, wherein the liquid comprising $Zr_4(OPr^n)_{16}$ further comprises methylcyclohexane.

4. The method of claim 3, further comprising rinsing the modified surface with methylcyclohexane after the contacting and before the activating.

5. The method of claim 1, wherein the $Zr_4(OPr^n)_{16}$ is analytically pure.

6. The method of claim 1, wherein the contacting is performed in an inert atmosphere.

7. The method of claim 1, wherein the activating comprises irradiating the modified surface.

8. The method of claim 1, wherein the activating comprises heating the modified surface.

9. The method of claim 1, wherein the activating comprises vacuum treating the modified surface.

10. The method of claim 1, wherein the activating comprises contacting the modified surface with an oxidizing agent.

11. The method of claim 1, wherein the activating comprises contacting the modified surface with an aqueous liquid to form a hydrolyzed surface.

12. The method of claim 11, wherein the aqueous liquid further comprises n-propanol.

13. The method of claim 11, further comprising drying the hydrolyzed surface after the contacting and after the activating.

14. The method of claim 1, wherein the contacting and activating are repeated at least two times.

15. The method of claim 1, wherein the contacting and activating are repeated at least ten times.

16. The method of claim 1, wherein the contacting and activating are repeated until the zirconia has an equivalent oxide thickness of not more than 2 nanometers.

17. The method of claim 1, further comprising heat treating the structure after the contacting and activating.

18. The method of claim 17, wherein the heat treating comprises heating the structure to at least 100° C. for at least 10 minutes.

19. The method of claim 17, wherein the heat treating comprises heating the structure to at least 300° C. for at least 20 minutes.

20. The method of claim 17, wherein the heat treating comprises heating the structure to at least 600° C. for at least 30 minutes.

21. The method of claim 1, wherein the semiconductor comprises silicon.

22. A method of making a semiconductor structure, comprising:

obtaining a liquid comprising analytically pure $Zr_4(OPr^n)_{16}$;

contacting a surface of a semiconductor with the liquid in an inert atmosphere to form a modified surface;

rinsing the modified surface;

hydrolyzing the modified surface with an aqueous liquid comprising n-propanol to form an activated surface;

drying the activated surface;

repeating the contacting, rinsing, hydrolyzing, and drying to form a layer of zirconia on the semiconductor surface; and heat treating the semiconductor comprising the layer of zirconia.

23. The method of claim 22, wherein the obtaining comprises distilling $Zr(OPr^n)_4$ and collecting analytically pure $Zr_4(OPr^n)_{16}$.

24. The method of claim 23, wherein the obtaining further comprises dissolving the analytically pure $Zr_4(OPr^n)_{16}$ in methylcyclohexane.

25. The method of claim 22, wherein the semiconductor comprises silicon.

26. The method of claim 25, wherein the semiconductor is Si(111).

27. The method of claim 26, wherein the surface of Si(111) has been treated with an aqueous solution of n-propanol and dried prior to contacting with the liquid comprising $Zr_4(OPr^n)_{16}$.

28. The method of claim 22, wherein the aqueous liquid comprises water and n-propanol in a weight ratio of 1:4.

29. The method of claim 22, wherein the repeating is performed at least two times.

30. The method of claim 22, wherein the repeating is performed at least ten times.

31. The method of claim 22, wherein the repeating is performed until the zirconia has an equivalent oxide thickness of not more than 2 nanometers.

32. The method of claim 22, wherein the heat treating comprises heating the semiconductor to at least 100° C. for at least 10 minutes.

33. The method of claim 22, wherein the heat treating comprises heating the semiconductor to at least 300° C. for at least 20 minutes.

34. The method of claim 22, wherein the heat treating comprises heating the semiconductor in an inert atmosphere to at least 600° C. for at least 30 minutes.

35. A method of making a semiconductor device, comprising:

making a semiconductor structure by the method of claim 1; and forming a semiconductor device from said structure.

36. A method of making a semiconductor device, comprising:

making a semiconductor structure by the method of claim 22; and forming a semiconductor device from said structure.

37. A method of making an electronic device, comprising:

making a semiconductor device by the method of claim 35; and forming an electronic device, comprising said semiconductor device.

38. A method of making an electronic device, comprising:

making a semiconductor device by the method of claim 36; and forming an electronic device, comprising said semiconductor device.

* * * * *

UNITED STATES PATENT AND TRADEMARK OFFICE
CERTIFICATE OF CORRECTION

| | | |
|---|---|---|
| PATENT NO. | : 6,794,315 B1 | |
| APPLICATION NO. | : 10/384186 | |
| DATED | : September 21, 2004 | |
| INVENTOR(S) | : Walter G. Klemperer et al. | |

It is certified that error appears in the above-identified patent and that said Letters Patent is hereby corrected as shown below:

Title page, (56) References Cited insert the following:

U.S. PATENT DOCUMENTS
-- 6,096,437        08/2000    Soucek et al.
6,139,813          10/2000    Narula et al.
6,143,272          11/2000    Narula et al.
6,288,255 B1       09/2001    Skinner
6,365,123 B1       04/2002    Narula et al.
6,660,686 B2       12/2003    Inagaki et al.

FOREIGN PATENT DOCUMENTS
JP 09-241008A2     09/1997

OTHER PUBLICATIONS
Bradley, D. C. et al., "PYROLYSIS OF METAL ALKOXIDES, I. THERMAL STABILITY OF SOME ZIRCONIUM ALKOXIDES", J. appl. Chem. Vol. 9, 1959, pp 435-439.
Bradley, D. C. et al., Structural Chemistry of the Alkoxides, Part IV.* Normal Alkoxides of Silicon, Titanium, and Zirconium.", J. Chem. Soc., 1953, pp. 2025-2030.
Bradley, D. C. et al., "THE PYROLYSIS OF METAL ALKOXIDES", Trans Faraday Sac., Vol. 55, 1959, pp. 2117-2123.
Bradley, D. C. et al., "Zirconium Alkoxides", J. Chem. Soc., 1951, pp. 280-285.
Covington, M., et al., "Observation of Surface-Induced Broken Time-Reversal Symmetry in YBa2Cu3O7 Tunnel Junctions", Physical Review Letters, 1997, Vol. 79, No. 2, pp. 277-280.
Day, Victor W., "Isolation and Structural Characterization of Tetra-n-propyl Zirconate in Hydrocarbon Solution and the Solid State", Inorg. Chem. Vol. 40, 2001, pp. 5738-5746.
Degraeve R. et al., "On the Electrical Characterization of High-k Dielectrics", MRS Bulletin, Vol. 27, March 2002, pp. 222-225. --

UNITED STATES PATENT AND TRADEMARK OFFICE
CERTIFICATE OF CORRECTION

PATENT NO.         : 6,794,315 B1
APPLICATION NO. : 10/384186
DATED                : September 21, 2004
INVENTOR(S)       : Walter G. Klemperer et al.

It is certified that error appears in the above-identified patent and that said Letters Patent is hereby corrected as shown below:

(56) References Cited

OTHER PUBLICATIONS (cont.)
-- Hentges, P.J., et al., "Fabrication of Tunnel Barriers on YBCO Thin Films by Chemical Surface Modification", Abstract from March 2000 meeting of the American Physical Society, printed from the Internet at: <http://www.aps.org/meet/MAROO/baps/abs/S2110001.html>, dated March 2000, 1 page.
Hentges, P.J., et al., "Observation of Sharp, New Density of States Features in Solution-Fabricated YBCO Planar Tunnel Junctions", Abstract from March 2001 meeting of the American Physical Society, printed from the Internet at: <http://www.aps.org/meet/MAROO/baps/abs/S5270003.html>, dated March 2001, 1 page.
Ichinose, Izumi et al., "A Surface Sol-Gel Process of Tl02 and Other Metal Oxide Films with Molecular Precision", Chem. Mater., 1997, Vol. 9, pp. 1296-1298.
Ichinose, Izumi et al., "Stepwise Adsorption of Metal Alkoxides on Hydrolyzed Surfaces: A Surface Sol-Gel Process", Chemistry Letters, 1996, pp. 831-832.
Kirk-Othmer, "Integrated Circuits", Encyclopedia of Chemical Technology; John Wiley & Sons publication, Fourth Edition, Vol. 14, copyright 1995, pp. 677-709.
Kukli, Kaupo et al., "Low-Temperature Deposition of Zirconium Oxide-Based Nanocrystalline Films by Alternate Supply of $Zr[OC(CH_3)_3]_4$ and $H_2O$", Chem. Vap. Deposition, Vol. 6, No. 6, 2000. pp 297-302.
Nicollian, E. H. et al., Chapter 6 "Interfacial Nonuniformities", MOS (Metal Oxide Semiconductor) Physics and Technology, John Wiley & Sons, Inc. publishers, copyright 2003, pp. 235-284.
Pafford, Margaret Mary, "SYNTHESIS AND CHARACATERIZATION OF ALKYL TETRA-, TRI-, AND TRISKAIDECAZIRCONATES", Doctoral Thesis submitted in the Graduate College of the University of Illinois at Urbana-Champaign, 2000, pp. i-Xiii and 1-167 pages.
Tada, Hiroaki, "Layer-by-Layer Construction of SiO . Film on Oxide Semiconductors", Langmuir. Vol. 11, No. 9, 1995, pp 3281-3284.
Turevskaya, E. P. et at., "The alkoxides of zirconium and hfnium: direct electrochemical synthesis and mass-spectral study. Do "M(OR)4", where M = Zr, Hr Sn, really exist?", Russ. Chem. Bull., 1995, Vol. 44, pp. 734-742.
Turova, N. Ya. et al., "Physicochemical approach to the studies of metal alkoxides", Polyhedron, 1998, Vol. 17, pp. 899-915. --

UNITED STATES PATENT AND TRADEMARK OFFICE
CERTIFICATE OF CORRECTION

PATENT NO. : 6,794,315 B1
APPLICATION NO. : 10/384186
DATED : September 21, 2004
INVENTOR(S) : Walter G. Klemperer et al.

It is certified that error appears in the above-identified patent and that said Letters Patent is hereby corrected as shown below:

(56) References Cited

OTHER PUBLICATIONS (cont.)
-- Van Zant, Peter, "Chapters Seven and Fourteen", Microchip Fabrication, Third Edition, copyright 1997, pp. 182-185 and pp 432-437.
Wilk, G.D. et al., "High-k gate dielectrics: Current status and materials properties considerations", J. App. Phys., Vol. 89, No. 10, May 2001, pp 5243-5275.
Zechmann, Cecilia A. et al., "Synthesis of Zirconium Pinacolate and Mechanism of Its Thermal Transformation to ZrO2: Impact of a Vicinal Diol Ligand", Chem. Mater., 1998, Vol. 10, No. 9, pp. 2348-2357.
Intel Announces Breakthrough In Chip Transistor Design, Intel Corporation Press Re/eases, obtained from the Internet on 12/5/01 at:
<http://www.intel.com/pressroom/archive/releases.2001112tech.htm>, pp 1-4 and accompanying attachments for Backgrounder 51 pages.
Lee, J. et at. "Molecular Layer Deposition Of Ultrathin Zirconia Films On Silicon Using Polynuclear Metal Alkoxide Precurosrs", MRS Symposium B: Silicon Materials - Processing, Characterization, and Reliability, Materials Research Society Spring Meeting, April 1-5, 2002, published in the Internet on March 6, 2002, 4 pages. --

Signed and Sealed this

Twenty-sixth Day of September, 2006

JON W. DUDAS
*Director of the United States Patent and Trademark Office*